(12) United States Patent
Thiel et al.

(10) Patent No.: US 11,703,538 B2
(45) Date of Patent: *Jul. 18, 2023

(54) MULTIPLE CIRCUIT BOARD TESTER

(71) Applicant: LAT Enterprises Inc., Raleigh, NC (US)

(72) Inventors: Laura Thiel, Raleigh, NC (US); Carlos Cid, Raleigh, NC (US); Michael Tran, Raleigh, NC (US); Giancarlo Urzi, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/570,076

(22) Filed: Jan. 6, 2022

(65) Prior Publication Data

US 2022/0128618 A1 Apr. 28, 2022

Related U.S. Application Data

(63) Continuation of application No. 17/345,685, filed on Jun. 11, 2021, now Pat. No. 11,221,360.

(60) Provisional application No. 63/038,381, filed on Jun. 12, 2020.

(51) Int. Cl.
*G01R 31/28* (2006.01)
*H05K 1/02* (2006.01)

(52) U.S. Cl.
CPC ..... *G01R 31/2801* (2013.01); *G01R 31/2868* (2013.01); *H05K 1/0268* (2013.01)

(58) Field of Classification Search
None
See application file for complete search history.

(56) References Cited

U.S. PATENT DOCUMENTS

| | | |
|---|---|---|
| 4,908,576 A | 3/1990 | Jackson |
| 6,118,292 A | 9/2000 | Antonello et al. |
| 6,525,526 B1 | 2/2003 | Gruyter et al. |
| 7,982,487 B2 | 7/2011 | Lorenz et al. |
| 9,632,133 B2 | 4/2017 | Chang |
| 9,651,613 B2 | 5/2017 | Chang |
| 9,995,767 B2 | 6/2018 | Rogel-Favila et al. |
| 10,161,962 B2 | 12/2018 | Rogel-Favila et al. |
| 11,221,360 B1 * | 1/2022 | Thiel .................. H05K 1/0268 |
| 2005/0184750 A1 | 8/2005 | Pan et al. |
| 2009/0000814 A1 | 1/2009 | Primavera et al. |
| 2011/0148448 A1 | 6/2011 | Onge et al. |
| 2011/0204910 A1 | 8/2011 | Suto |
| 2015/0168485 A1 | 6/2015 | Chang |
| 2018/0217200 A1 | 8/2018 | Dehmel et al. |

* cited by examiner

*Primary Examiner* — Jermele M Hollington
(74) *Attorney, Agent, or Firm* — Neo IP

(57) ABSTRACT

The present invention is directed to a system for testing printed circuit boards. The system is configured to test the simultaneously test a multiplicity of printed circuit boards. The system examines the electrical characteristics of a printed circuit board and is operable to identify if a printed circuit board meets a desired characteristic.

20 Claims, 6 Drawing Sheets

MULTIPLE CIRCUIT BOARD TESTER

CROSS REFERENCES TO RELATED APPLICATION

This application is related to and claims priority from the following U.S. patents and patent applications. This application is a continuation of U.S. application Ser. No. 17/345,685, filed Jun. 11, 2021, now U.S. Pat. No. 11,221,360, which claims priority to U.S. Provisional Application No. 63/038,381, filed Jun. 12, 2020, each of which is incorporated herein by reference in its entirety.

BACKGROUND OF THE INVENTION

1. Field of the Invention

The present invention relates to printed circuit boards, and more specifically to printed circuit boards testing fixtures configured for simultaneously testing of multiple printed circuit boards.

2. Description of the Prior Art

It is generally known in the prior art to provide parallel testing for testing printed circuit boards.

Prior art patent documents include the following:

U.S. Patent Publication No. 2018/0217200 for positioning device for a parallel tester for testing printed circuit boards and parallel tester for testing printed circuit boards by inventors Dehmel, et al., filed Jun. 17, 2016 and published Aug. 2, 2018, is directed to a positioning device for a parallel tester, a parallel tester, and a method for testing a circuit board. According to a first aspect of the invention, a positioning device is provided for fine adjustment purposes, in which the test adapter can be fastened to an inner holding piece of a holding device and the inner holding piece is supported so that it is able to move relative to the rest of the positioning device. As a bearing, only one or more swivel joints and/or one or more air bearings and/or one or more magnetic bearings is/are provided.

U.S. Patent Publication No. 2009/0000814 for multiple layer printed circuit board having misregistration testing pattern by inventors Primavera, et al., filed Apr. 23, 2008 and published Jan. 1, 2009, is directed to a method of testing for misregistration in a multiple layer printed circuit board including providing an electrical test pattern on one or more layers of the board, testing for an electrical signal between the test pattern and a test reference, and determining layer-to-layer misregistration based on the results of the testing. A method of manufacturing a multiple layer board that is configured to facilitate non-destructive testing of layer-to-layer misregistration includes forming an electrical test pattern on a first layer and forming a corresponding electrical test reference on a second layer. Then, a connecting pathway is formed between the test reference and the test pattern, including the first and second layers, with testing for an electrical signal between the test reference and the test pattern determining layer-to-layer misregistration of the first layer with respect to the second layer.

U.S. Pat. No. 10,161,962 for universal test cell by inventors Rogel-Favila, et al., filed Oct. 15, 2014 and issued Dec. 25, 2018, is directed to a universal test cell including a plurality of test slots configured to receive a plurality of universal test containers each including similar dimensions. Each universal test container is configured to enclose each of a plurality of different devices to test. Each universal test container includes an external electrical interface configured to couple to each of the plurality of different devices to test. The universal test cell is configured to test the plurality of different devices while each is located within a universal test container of the plurality of universal test containers. The universal test cell includes a plurality of universal electrical interfaces that are each configured to couple with the external electrical interface of each universal test container.

U.S. Pat. No. 9,995,767 for universal container for device under test by inventors Rogel-Favila, et al., filed Oct. 15, 2014 and issued Jun. 12, 2018, is directed to a universal test container including a universal external electrical interface configured to couple to each of a plurality of different devices to test. In addition, the universal test container is configured to enclose each of the plurality of different devices to test.

U.S. Pat. No. 7,982,487 for system for multiple printed circuit board misregistration testing by inventors Lorenz, et al., filed Sep. 30, 2009 and issued Jul. 19, 2011, is directed towards a test apparatus for determining layer-to-layer misregistration of a multiple layer printed circuit board having an electrical test pattern formed on an inner layer and an electrical test reference formed on an outer layer with the reference electrically connected to the pattern. The apparatus includes a holder for the board, an electrical input device that moves into and out of connection with the reference when the board is in the holder, with the input device adapted to provide a signal to the reference, and an electrical output probe configured to move into and out of electrical connection with the pattern when the board is in the holder. The output probe is adapted to receive at least one signal from the pattern when a signal is provided to the reference, such that the signal received by the output probe conveys layer-to-layer misregistration between the inner layer and the outer layer.

U.S. Pat. No. 6,525,526 for method and device for testing printed circuit boards by inventors Gruyter, et al., filed Feb. 10, 1999 and issued Feb. 25, 2003, is directed to testing printed circuit boards in accordance with a method in which the circuit boards are brought into contact with conducting test-contact elements at certain contact points which are connected to the conductor tracks, the test-contact elements or a partial number thereof are connected, in succession in clock-pulsed manner according to a certain test program, to a test-voltage source and during each test clock pulse the flowing via the test-contact elements or a parameter related thereto is measured. Particularly for circuit boards to be tested having a high contact-point density, the testing-time can be shortened by the circuit boards being subdivided into a plurality of test areas and all or at least some of the test areas being tested in parallel. The method is especially suitable for circuit boards that are produced in a multiple panel.

U.S. Pat. No. 6,118,292 for method and device for correcting misalignment between test needles during electrical testing of printed circuit boards by inventors Antonello, et al., filed Nov. 25, 1997 and issued Sep. 12, 2000, is directed to a method for correcting misalignment between test needles and test points during multiple electrical tests on printed circuit boards, in which setting up the machine to carry out the test on a circuit board or group of circuit boards, and hence correction of any misalignment, takes place without removing the circuit boards from the test area. The patent also relates to a device for correction of misalignment, that uses one or more mobile plates, depending upon whether the test is performed on only one side or on both sides of the printed circuit board, both mobile plates being disposed on the same interface of the test machine and operating respectively on centering pins of the printed circuit board and on centering pins carried by a mobile structure of the other interface of the test machine, the mobile plates being moved by at least three respective linear actuators acting on respective outer edges of the plates, to give them a rotational translational motion.

SUMMARY OF THE INVENTION

The present invention relates to printed circuit board testing.

It is an object of this invention to provide a printed circuit board testing fixture that is operable for simultaneous testing of multiple printed circuit boards.

In one embodiment, the present invention includes a system for testing multiple printed circuit boards (PCBs) including a PCB testing fixture, a battery tester, a data acquisition unit including a multiplexer, a software platform, and at least one remote device, wherein the data acquisition unit is in network communication with the software platform and the PCB testing fixture, wherein the at least one remote device is in network communication with the software platform, wherein the PCB testing fixture is configured to receive a plurality of PCBs, wherein the PCB testing fixture is configured to provide an electric stimulus generated by the battery tester to each PCB of the plurality of PCBs, wherein the PCB testing fixture is configured to generate PCB output data for each PCB of the plurality of PCBs, wherein the PCB testing fixture is configured to transmit the PCB output data to the data acquisition unit, wherein the software platform is configured to analyze the PCB output data, wherein the software platform is configured to determine if each PCB of the plurality of PCBs meets at least one output requirement, and wherein the at least one remote device is configured to display the analyzed PCB output data.

In another embodiment, the present invention includes a printed circuit board (PCB) testing device including a power supply, a plurality of spring-loaded pins, a data acquisition unit including a multiplexer, and an indicator, wherein the PCB testing device is configured to receive a plurality of PCBs via the plurality of spring-loaded pins, wherein the PCB testing device is configured to send an electric stimulus to the plurality of PCBs via the power supply, wherein the PCB testing device is configured to capture PCB output data, wherein the PCB output data includes voltage data, capacitance data, and resistance data, wherein the PCB testing device is further configured to receive at least one PCB output requirement via user input and/or at least one remote device, and wherein the indicator is configured to provide an alert if at least one PCB of the plurality of PCBs does not meet the at least one PCB output requirement.

In yet another embodiment, the present invention includes a method of simultaneously testing printed circuit boards (PCBs) including attaching at least one PCB to a PCB testing fixture, wherein the PCB testing fixture is configured to receive a plurality of PCBs, providing an electric stimulus to the at least one PCB via a power source, wherein the power source is attached to the PCB testing fixture, capturing PCB output data via the PCB testing fixture, wherein the PCB testing fixture includes a data acquisition unit to acquire the PCB output data, transmitting the PCB output to a remote device via network communication, analyzing the PCB output data via a software platform including an analysis component on the remote device, determining whether the at least one PCB meets at least one specification requirement based on the PCB output data, and generating at least one alert based on whether the at least one PCB meets the at least one specification requirement.

These and other aspects of the present invention will become apparent to those skilled in the art after a reading of the following description of the preferred embodiment when considered with the drawings, as they support the claimed invention.

DETAILED DESCRIPTION

Figure 1:
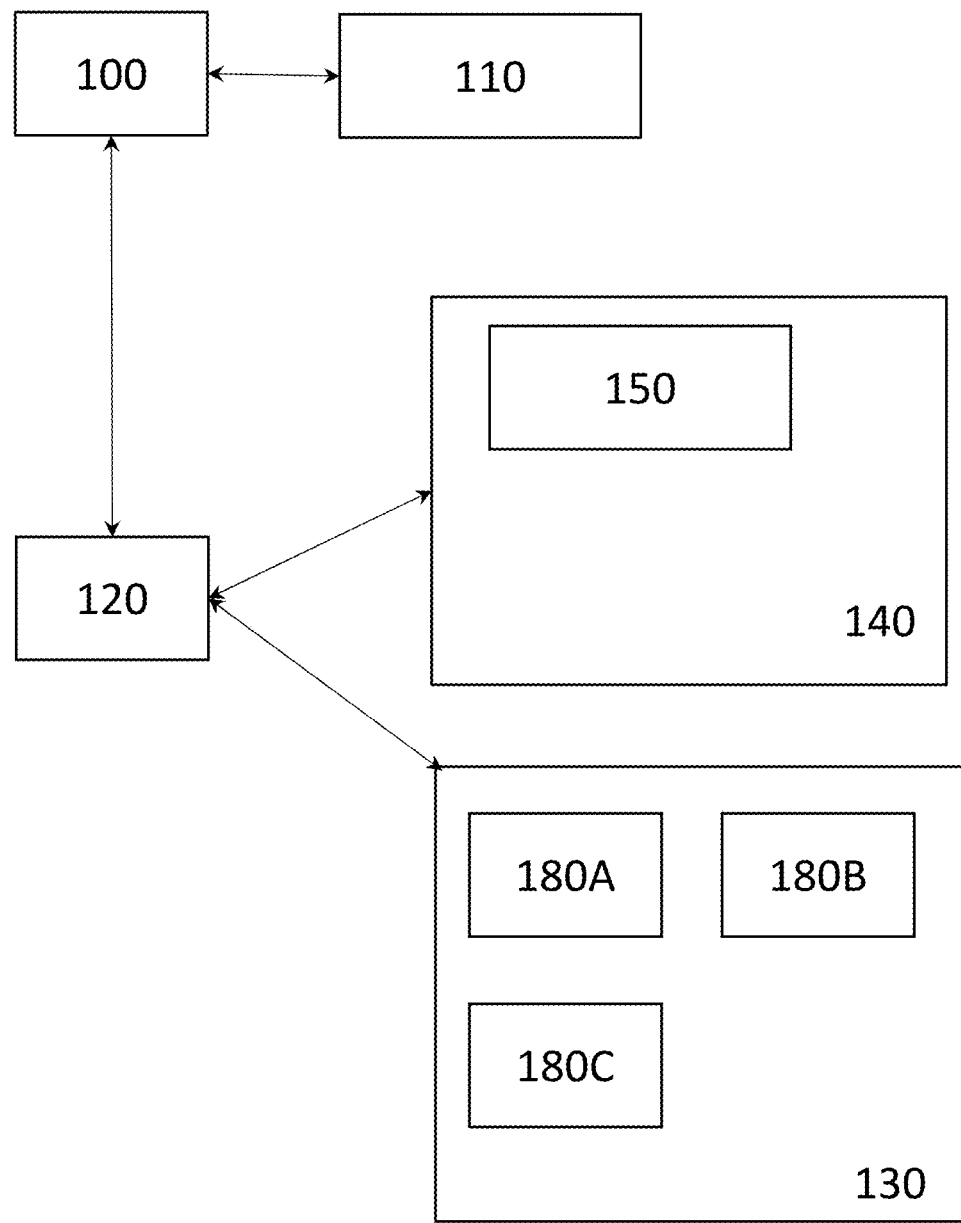
FIG. 1 illustrates a schematic diagram of a printed circuit board testing system according to one embodiment of the present invention.

The present invention is generally directed to a system for testing printed circuit board.

In one embodiment, the present invention includes a system for testing multiple printed circuit boards (PCBs) including a PCB testing fixture, a battery tester, a data acquisition unit including a multiplexer, a software platform, and at least one remote device, wherein the data acquisition unit is in network communication with the software platform and the PCB testing fixture, wherein the at least one remote device is in network communication with the software platform, wherein the PCB testing fixture is configured to receive a plurality of PCBs, wherein the PCB testing fixture is configured to provide an electric stimulus generated by the battery tester to each PCB of the plurality of PCBs, wherein the PCB testing fixture is configured to generate PCB output data for each PCB of the plurality of PCBs, wherein the PCB testing fixture is configured to transmit the PCB output data to the data acquisition unit, wherein the software platform is configured to analyze the PCB output data, wherein the software platform is configured to determine if each PCB of the plurality of PCBs meets at least one output requirement, and wherein the at least one remote device is configured to display the analyzed PCB output data.

In one embodiment, the PCB output data includes voltage data, resistance data, and/or capacitance data. In another embodiment, the software platform is configured to generate an alert if the at least one output requirement is not met. In yet another embodiment, the software platform is configured to generate at least one recommendation based on the PCB output data. In another embodiment, the plurality of PCBs includes at least two PCBs, wherein the at least two PCBs include a first PCB and a second PCB, wherein the first PCB has a first output voltage requirement, wherein the second PCB has a second output voltage requirement, and wherein the first output voltage requirement is different from the second output voltage requirement. In another embodiment, the first output voltage requirement is about 30 volts, and the second output voltage requirement is about 17 volts. In another embodiment, the plurality of PCBs include at least three PCBs, wherein the first PCB of the at least three PCBs has a first output voltage requirement, wherein the second PCB of the at least three PCBs has a second output voltage requirement, wherein the third PCB of the at least three PCBs has a third output voltage requirement, wherein the first output voltage requirement is greater than the second output voltage requirement, and wherein the second output voltage requirement is greater than the third output voltage requirement. In yet another embodiment, the software platform is further configured to determine whether one or more of the plurality of PCBs has a short circuit and/or an open circuit based on the PCB output data, and wherein the software platform is further configured to provide at least one recommendation if the one or more of the plurality of PCBs has a short circuit and/or an open circuit. In another embodiment, the software platform includes a training application, wherein the training application is configured to simulate a circuit, and wherein the simulated circuit is based on at least one specification requirement.

In another embodiment, the present invention includes a printed circuit board (PCB) testing device including a power supply, a plurality of spring-loaded pins, a data acquisition unit including a multiplexer, and an indicator, wherein the PCB testing device is configured to receive a plurality of PCBs via the plurality of spring-loaded pins, wherein the PCB testing device is configured to send an electric stimulus to the plurality of PCBs via the power supply, wherein the PCB testing device is configured to capture PCB output data, wherein the PCB output data includes voltage data, capacitance data, and resistance data, wherein the PCB testing device is further configured to receive at least one PCB output requirement via user input and/or at least one remote device, and wherein the indicator is configured to provide an alert if at least one PCB of the plurality of PCBs does not meet the at least one PCB output requirement.

In one embodiment, the plurality of PCBs includes at least two PCBs, wherein the at least two PCBs include a first PCB and a second PCB, wherein the first PCB has a first output voltage requirement, wherein the second PCB has a second output voltage requirement, and wherein the first output voltage requirement is different from the second output voltage requirement. In another embodiment, the first output voltage requirement is about 30 volts, and the second output voltage requirement is about 17 volts. In another embodiment, the indicator includes a visual indicator, wherein the visual indicator includes a light emitting diode (LED) display, wherein the LED display is configured to provide an alert when the PCB testing device determines that at least one PCB of the plurality of PCBs does not meet the at least one PCB output requirement, wherein the alert indicates a level of failure, and wherein the LED display is configured to generate a red light for complete failure. In another embodiment, the system for testing multiple printed circuit boards further includes a robotic soldering component, wherein the robotic soldering component is operable to receive a command from at least one remote device, and wherein the command includes at least one position on at least one PCB of the plurality of PCBs to solder. In another embodiment, the PCB testing device is configured to simultaneously test a first side and a second side of at least one PCB of the plurality of PCBs. In yet another embodiment, each spring-loaded pin of the plurality of spring-loaded pins is attached to a position component, wherein the position component is configured to move one or more of the plurality of spring-loaded pins to connect to at least one PCB of the plurality of PCBs.

In yet another embodiment, the present invention includes a method of simultaneously testing printed circuit boards (PCBs) including attaching at least one PCB to a PCB testing fixture, wherein the PCB testing fixture is configured to receive a plurality of PCBs, providing an electric stimulus to the at least one PCB via a power source, wherein the power source is attached to the PCB testing fixture, capturing PCB output data via the PCB testing fixture, wherein the PCB testing fixture includes a data acquisition unit to acquire the PCB output data, transmitting the PCB output to a remote device via network communication, analyzing the PCB output data via a software platform including an analysis component on the remote device, determining whether the at least one PCB meets at least one specification requirement based on the PCB output data, and generating at least one alert based on whether the at least one PCB meets the at least one specification requirement.

In one embodiment, the method of simultaneously testing printed circuit boards (PCBs) further includes generating an electrical circuit analysis report via the at least one remote device, wherein the electrical circuit analysis report includes a component breakdown of the at least one PCB. In another embodiment, the method of simultaneously testing printed circuit boards (PCBs) further includes the software platform generating at least one recommendation to improve the at least one PCB based on the PCB output data. In one embodiment, the at least one PCB includes at least two PCBs, and the method further includes simultaneously supplying the electrical stimulus to the at least two PCBs, analyzing the PCB output data of the at least two PCBs, and generating at least one alert if the PCB output data of one or more of the at least two PCBs is below at least one voltage cutoff.

None of the prior art discloses a printed circuit board testing system as disclosed herein.

Generally, when testing printed circuit boards, a user must manually turn voltage knobs and record when the printed circuit boards turns on and off. Additionally, some testing fixtures are limited in the number of printed circuit boards that can be tested simultaneously. Another problem faced by typical printed circuit board testing systems is having to create new software code and/or analysis for printed circuit boards with different specifications. During functional circuit testing of a printed circuit board, a stimulus is applied to a printed circuit board and the output voltage is recorded. A low and high voltage cutoff is captured for a printed circuit board.

Manually testing printed circuit boards (e.g., by hand) is time consuming. Additionally, manually testing printed circuit boards is subject to human error. It is not possible to test multiple printed circuit boards at the same time when manually testing. Further, there is no automated record of the test data. For example, it would be advantageous to have a record of a printed circuit board that is close to being out of specification.

Typically, a printed circuit board testing system requires new software code to adapt to new specifications. Therefore, there is a need for a printed circuit board system that is configured to simultaneously test a multiplicity of printed circuit boards and adapt to printed circuit boards of different specifications. For example, a first type of printed circuit board having a first specification and a second type of printed circuit board having a second specification are operable to be tested simultaneously. In one embodiment, the first specification is a first output voltage (e.g., about 30 volts) and the second specification is a second output voltage (e.g., about 17 volts). In one embodiment, "about" means that an actual voltage is within ±10% of a target voltage. In one embodiment, the first type of printed circuit board and the second type of printed circuit board are operable to connect to the PCB testing device at the same connection points.

System

In one embodiment, the present invention includes a system for testing printed circuit boards. The system is configured to simultaneously test a multiplicity of printed circuit boards. Advantageously, the system is configured to identify which printed circuit boards meet manufacturing specifications. The system is further operable to identify which components of a printed circuit board are not operating according to the desired specifications. In another embodiment, the system includes a PCB testing fixture, software, a controller, a multiplexer, and a data acquisition unit.

The present invention is directed to testing printed circuit board functionality. In one embodiment, the present invention is configured to apply an electric stimulus to a PCB testing fixture. The present invention is further operable to capture and record the response from at least one PCB and determine if the electrical response is within a desired voltage range. Advantageously, the present invention is operable to test the voltage, capacitance, and/or resistance of a printed circuit board, and capture and record this data as well.

PCB Testing Fixture

The PCB Testing Fixture includes at least one connector. The at least one connector is configured to attach to a printed circuit board. In one embodiment, the PCB Testing Fixture is configured to simultaneously test 10 printed circuit boards at one time. Advantageously, the PCB Testing Fixture is configured to simultaneously test 10 printed circuit boards with different specifications (e.g., voltage ranges, voltage cutoffs, current limits). For example, and not limitation, in one embodiment, the PCB Testing Fixture is configured to receive at least three PCBs, each with a different output voltage requirement. The PCB Testing Fixture is operable to simultaneously test each of the at least three PCBs. The PCB Testing Fixture is further operable to determine the presence of a fuse and check if the fuse is functioning properly during testing. In another embodiment, the PCB Testing Fixture includes at least one spring-loaded pin. A PCB is pressed on one or more of the at least one spring-loaded pin to create contact with the PCB Testing Fixture.

In one embodiment, the PCB Testing Fixture includes a position component attached to a plurality of contact elements that are operable to simultaneously contact a multiplicity of PCB testing points on a PCB. In another embodiment, the position component is configured to rotate, translate, and/or otherwise move to reposition the plurality of contact elements to a desired position to adapt to PCBs of various shapes and sizes. The PCB Testing Fixture further includes at least one locking mechanism to maintain contact between a PCB and the plurality of contact elements.

In yet another embodiment, the PCB Testing Fixture is configured to test each electrical node and/or net on a PCB to individually test and analyze PCB components. The PCB Testing Fixture is operable to run bare board tests to capture voltage data, capacitance data, and/or resistance data. The PCB Testing Fixture is further configured to test for open circuits and/or short circuits by charging a net or a plane and then probing each net or plane to measure the induced capacity. In another embodiment, the PCB Testing Fixture is configured to perform a functional test on the PCB. The PCB Testing Fixture is further operable to test isolation between conductors. In one embodiment, the PCB Testing Fixture is operable to simultaneously test both sides of a PCB. In yet another embodiment, the PCB Testing Fixture is configured for impedance testing and analysis, impedance control, in-circuit testing, isolation resistance testing, open circuit testing, and short circuit testing.

In one embodiment, the PCB Testing Fixture is operable to test at least one through-hole PCB. In another embodiment, the PCB Testing Fixture is configured to test a surface mount PCB. Alternatively, the PCB Testing Fixture is configured to test at least one of the following: a single layer PCB, a double layer PCB, a multi-layer PCB, a rigid PCB, and/or a flexible PCB.

In another embodiment, the PCB Testing Fixture includes a soldering component (e.g., a soldering iron) and/or a PCB cutting component. In one embodiment, the soldering component and/or the PCB cutting component is robotic. In yet another embodiment, the soldering component is configured to be controlled via a remote device. Advantageously, this enables remote soldering of a PCB if the present invention determines that the PCB is malfunctioning. In another embodiment, the cutting component includes a saw, a blade, or other similar cutting devices. In one embodiment, the cutting component is operable to be controlled via a remote device. Alternatively, the cutting component is operable to be manually controlled by a user.

In yet another embodiment, the PCB Testing Fixture includes at least one sensor. In one embodiment, the at least one sensor includes, but is not limited to, an accelerometer, a photodiode, a piezoelectric sensor, a wireless network sensor, and/or a temperature sensor. In another embodiment, the at least one sensor is configured to identify where a PCB needs to be cut. For example, and not limitation, the at least one sensor includes a light projection component that is operable to project a light over the part of a PCB that needs to be cut.

In another embodiment, the present invention includes at least one indicator. The at least one indicator includes a visual, an audio, and/or an audiovisual indicator. For example, and not limitation, the at least one indicator includes a piezoelectric buzzer and/or a light-emitting diode (LED) indicator. The at least one indicator is configured to generate an alert when the PCB Testing Fixture detects that at least one PCB is not performing to the desired requirements. In another embodiment, the at least one indicator is configured to generate an alert based on a level of failure. For example, and not limitation, the LED indicator is configured to generate a red alert for a complete failure, a yellow alert for a local repair, or a green alert if a PCB passes all tests and meets the desired specification.

Software

In one embodiment, the software component of the present invention is configured to determine power consumption and voltage output of a circuit board via PCB output data received from the data acquisition unit. The software is further configured to generate an alert if a printed circuit board is not properly aligned on the printed circuit board testing fixture.

In another embodiment, the present system includes a software platform. The software platform includes a database of different printed circuit board test routines. Furthermore, the software is operable to diagnose failures on the printed circuit board and recommend a change of at least one component of the printed circuit board or a modification to the printed circuit board. For example, and not limitation, if the voltage cutoff is too low for a printed circuit board, then the present invention is operable to recommend adjusting the voltage on a diode. In one embodiment, the diode of the present invention is configured for a voltage adjustment range between 0.01 V to 1 V. In another example, the present invention is operable to recommend cutting a trace on the printed circuit board to meet a desired specification. The software platform advantageously provides information regarding whether a printed circuit board requires a local repair or is a catastrophic failure to an operator. The software platform is operable to adapt a new electrical device and provide circuit analysis based on data collected by the PCB Testing Fixture.

In one embodiment, the software platform includes a mobile application on at least one mobile device (e.g., smartphone, tablet). The mobile application is configured for augmented reality, virtual reality, problem solving, and/or analytics applications. In one embodiment, the mobile application is configured for augmented reality (AR) and/or virtuality reality (VR). The AR/VR application includes a multiplicity of settings. The multiplicity of settings include training and testing modes. For example, and not limitation, the training mode is configured to teach common problems with a PCB and how to diagnose and remedy the problems to a user. The training mode is configured to show common problems including, but not limited to, overheated joints, solder joints with too much solder or insufficient wetting, unstable components with disturbed joints, open circuits, short circuits, missing components, and/or misaligned components. Advantageously, the AR/VR mode is configured to teach how to properly attach a PCB to the PCB Testing Fixture.

In yet another embodiment, the present invention includes a haptic feedback component that functions in coordination with the AR/VR application. For example, and not limitation, the haptic feedback component includes an actuator. The haptic feedback component is configured to vibrate when a user incorrectly performs a training task. Alternatively, the haptic feedback component vibrates when a user does something correctly. In another embodiment, the haptic feedback component is configured to provide feedback relating to the level of mistake that a user makes. For example, and not limitation, if a user improperly aligns a component and the result could severely damage the PCB, then the haptic feedback component is configured to generate a high intensity vibration until the mistake is corrected (e.g., cut the trace or changing out a diode). Alternatively, in another embodiment, the present invention includes a brain-machine interface that enables control of the software and/or testing fixture based on neuronal information.

The AR/VR application is further configured to provide a breakdown of PCB components and illustrate how to modify each component and the effects of changing the various components. For example, and not limitation, the AR/VR application is operable to illustrate the effect of changing a diode from 0.1 V to 1 V. Another aspect of the AR/VR application is that it enables a user to simulate building a PCB. The software platform is configured to receive and design specifications for a PCB. The AR/VR application is operable to build a prototype PCB based on the design specification. Advantageously, the software platform is configured to provide suggestions for each PCB component to meet the design specifications.

In one embodiment, the software platform is configured to generate an alert. In another embodiment, the alert includes if a component needs to be replaced, modified, and/or is missing. In yet another embodiment, the alert is related to a voltage, a current, and/or a capacitance. In one embodiment, the alert indicates a level of failure (e.g., catastrophic, local repair). In yet another embodiment, the alert indicates whether the PCB passed all test routines.

The software platform is preferably connected (e.g., via network communication) to at least one database. The at least one database is operable to store information including, but not limited to, PCB output data, analyzed PCB output data, test routines, serial numbers related to products including a PCB, shipment dates for the products, complaints related to the products, failures related to the products, expiration dates for the products, warranty information for the products, and/or company information related to the products.

Controller

In one embodiment, the printed circuit board testing system includes a controller. The controller is configured to change at least one setting for the PCB Testing Fixture. The PCB Testing Fixture settings include voltage requirements, power source, device type, number of devices and other similar settings. Advantageously, the PCB Testing Fixture is operable to test PCBs for a multiplicity of electrical devices. For example, and not limitation, the PCB Testing Fixture is operable to test PCBs for batteries. The controller is configured to switch the PCB Testing Fixture settings to adapt to PCBs of the new electrical device. The controller is further operable to communicate with a software platform. For example, and not limitation, the controller is configured to modify a voltage cutoff.

Circuit

In one embodiment, the present invention includes at least one circuit. In another embodiment, the at least one circuit is a multiplexer. The multiplexer is operable to transmit a control signal to the PCB Testing Fixture to switch between a multiplicity of data inputs.

Data Acquisition Unit

In one embodiment, the present invention includes a power supply (e.g., a direct current source), a ground, a positive connection, and a negative connection. Additionally, the present invention includes at least one data connection channel. The data connection channel is operable to connect with at least one PCB. In yet another embodiment, the PCB Testing Fixture includes a power circuit that controls power to at least one PCB. In one embodiment, the PCB Testing Fixture is operable to test at least one printed circuit board in the field (e.g., portable).

The present invention is directed to testing printed circuit board functionality. In one embodiment, the present invention applies an electric stimulus to a PCB Testing Fixture containing a plurality of PCBs to be tested (e.g., via the power supply). The present invention is further operable to capture a response from each of the plurality of PCBs and determine if the electrical response of each of the each of the plurality of PCBs is within specification (e.g., a desired voltage range).

Referring now to the drawings in general, the illustrations are for the purpose of describing one or more preferred embodiments of the invention and are not intended to limit the invention thereto.

FIG. 1 illustrates a schematic diagram of a printed circuit board testing system according to one embodiment of the present invention. The PCB testing system includes at least one remote device 100, a software platform 110, a battery tester 120, a PCB testing fixture 130, and/or a data acquisition unit 140 with a multiplexer 150. In another embodiment the PCB testing system further includes a digital multimeter. The at least one remote device 100 includes a computer, a laptop, a mobile device (e.g., smartphone, tablet), and/or other similar electronic devices. The software platform 110 is in network communication with the at least one remote device 100.

The at least one remote device 100 is in network and/or wired communication with the battery tester 120. The battery tester 120 is connected to the PCB testing fixture 130 and the data acquisition unit 140 with the multiplexer 150. The PCB testing fixture 130 is configured to receive a plurality of PCBs (e.g., a first PCB 180A, a second PCB 180B, a third PCB 180C). The battery tester 120 is operable to configured to apply an electric stimulus to the plurality of PCBs in the PCB testing fixture 130. The PCB testing fixture 130 is configured to generate PCB output data for each PCB of the plurality of PCBs based on the electric stimulus. The PCB testing fixture 130 is configured to transmit the PCB output data to the data acquisition unit 140. In one embodiment, the battery tester 120 is connected to the PCB testing fixture 130 via a wired connection.

The data acquisition unit 140 is preferably operable to transmit PCB output data to a software platform via a network connection (e.g., wired or wireless). In one embodiment, the software platform is on at least one remote device. The at least one remote device includes, but is not limited to, a desktop computer, a laptop computer, a server, a smartphone, and/or a tablet. The software platform is operable to analyze the PCB output data, thereby generating analyzed PCB output data. The software platform is configured to determine if each of the plurality of PCBs meets at least one output requirement (e.g., voltage, current, capacitance). The at least one remote device is preferably operable to display the analyzed PCB output data.

Figure 2:
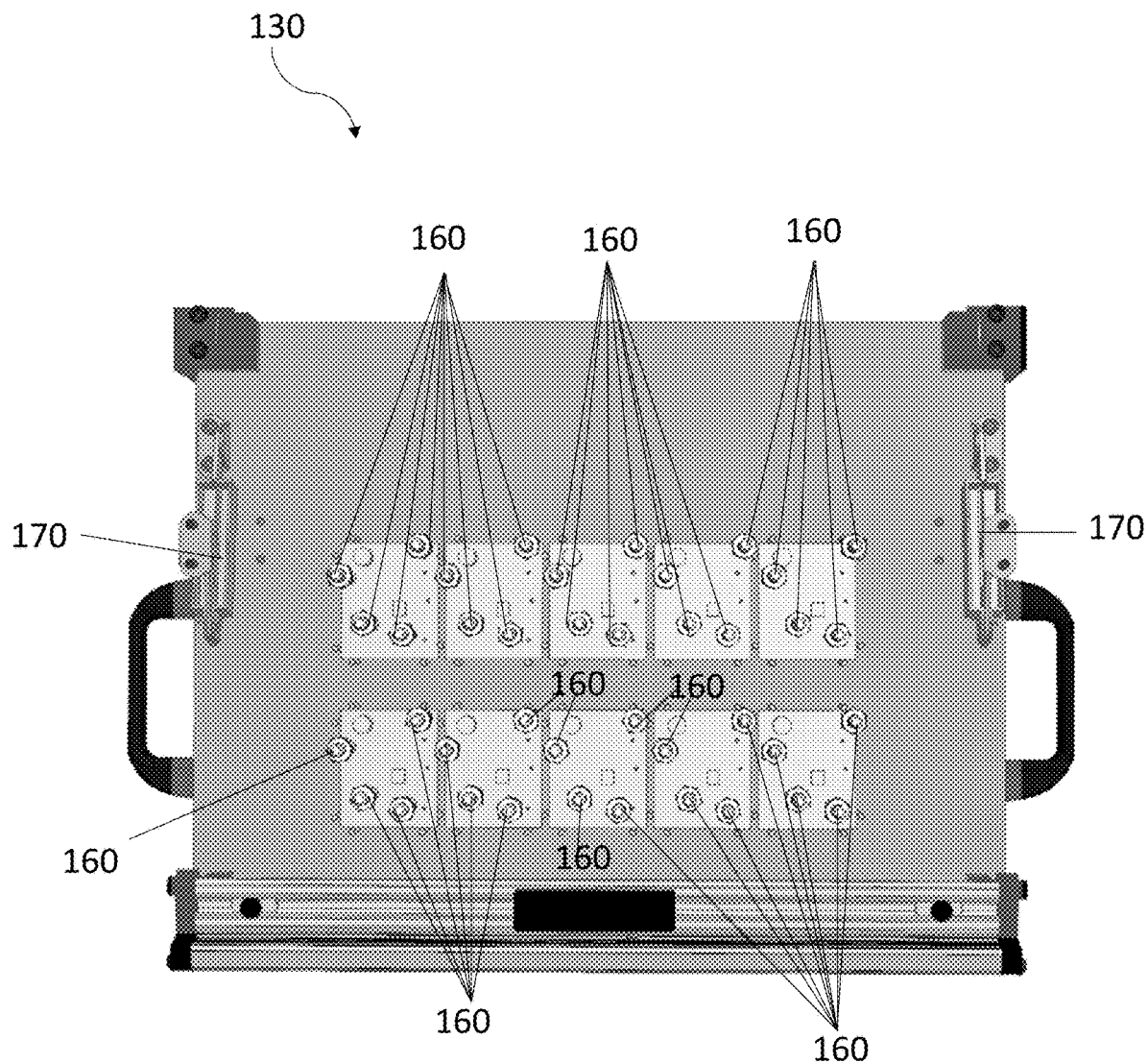
FIG. 2 illustrates a top perspective of a printed circuit board testing fixture according to one embodiment of the present invention.
Figure 3:
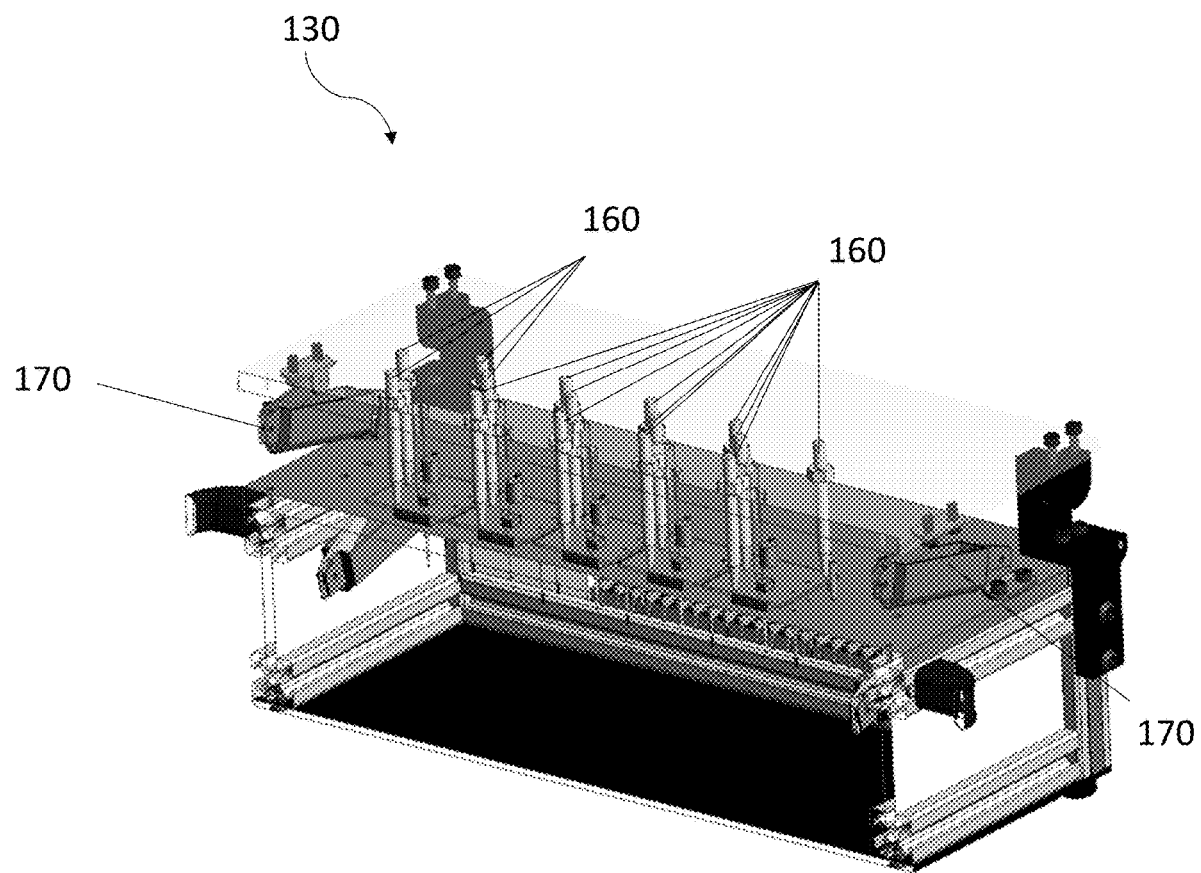
FIG. 3 illustrates a cross-sectional view of a printed circuit board testing fixture according to one embodiment of the present invention.
Figure 4:
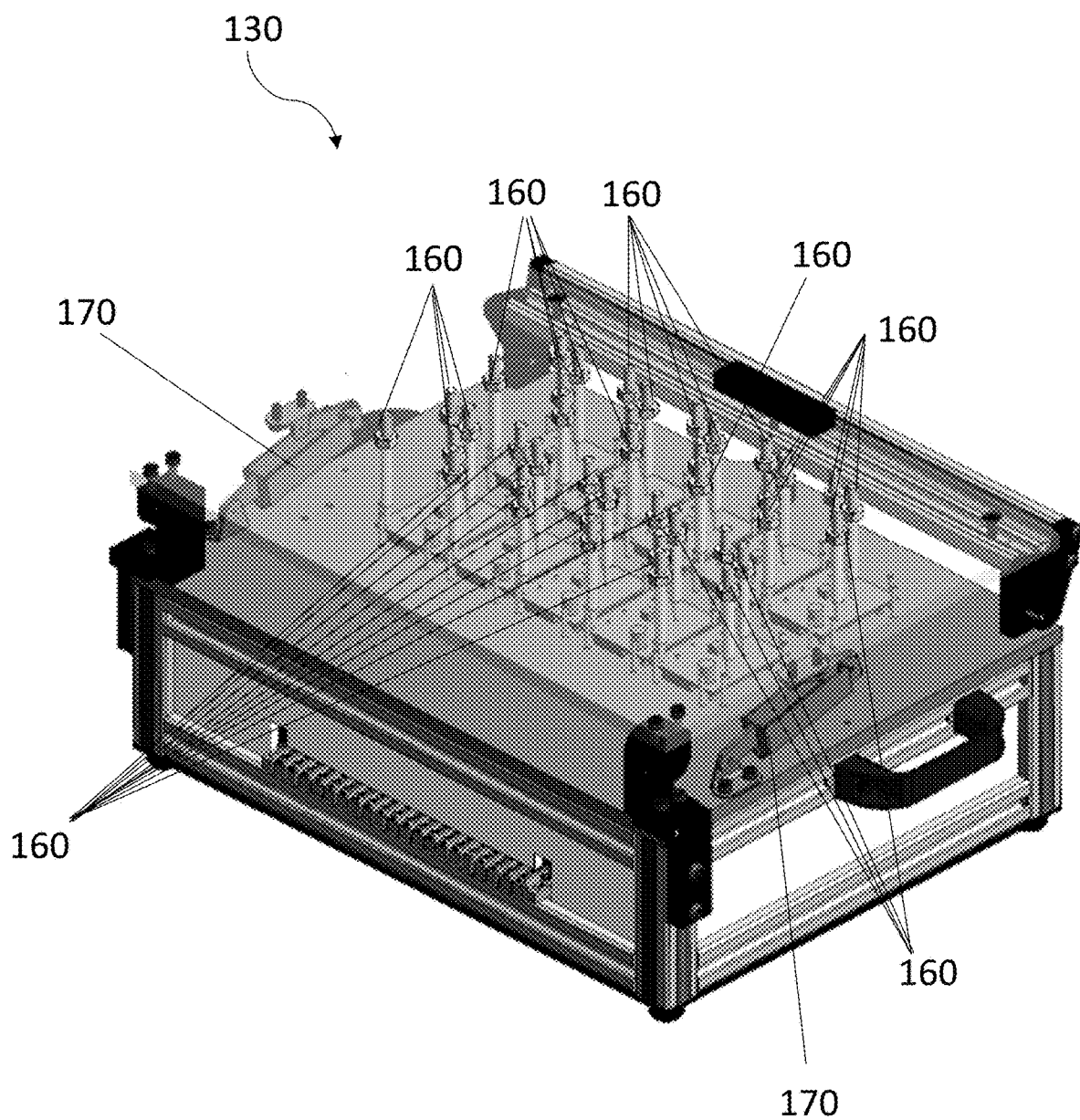
FIG. 4 illustrates a side perspective of printed circuit board testing fixture according to one embodiment of the present invention.
Figure 5:
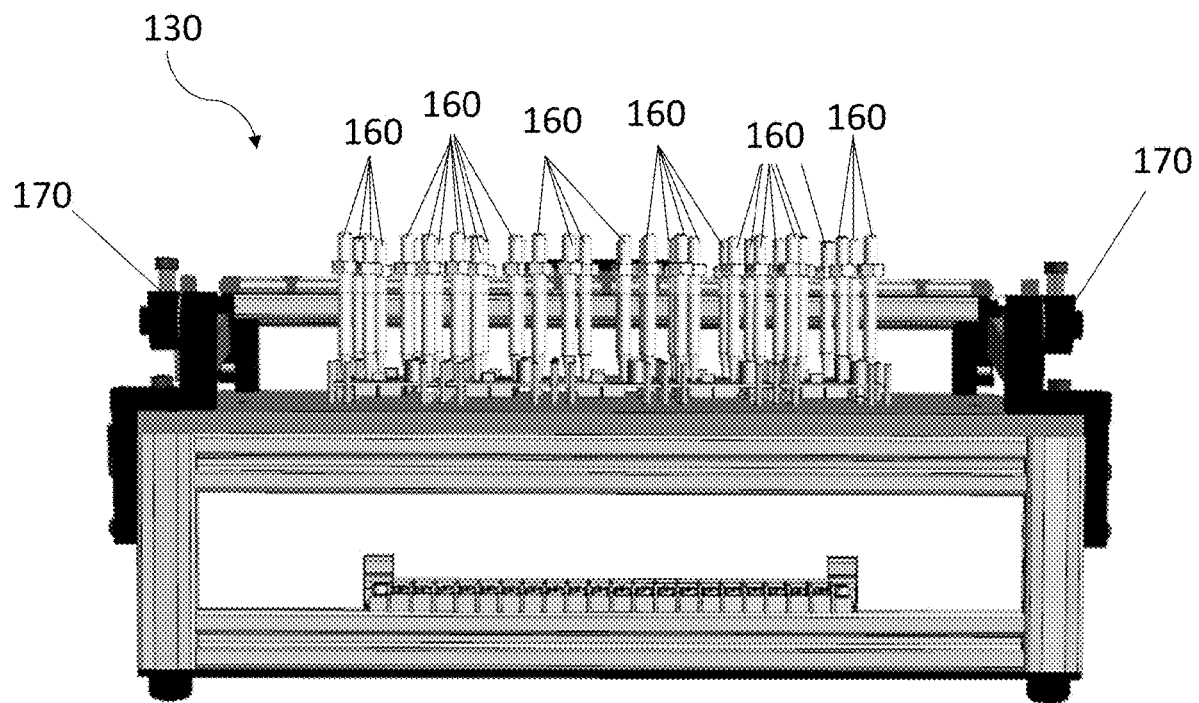
FIG. 5 illustrates a front view of a printed circuit board testing fixture.

FIG. 2 illustrates a top perspective of a printed circuit board testing fixture according to one embodiment of the present invention. The printed circuit board testing fixture 130 includes at least one pin 160 that allows at least one electrical device to connect the printed circuit board testing fixture 130. The printed circuit board testing fixture 130 further includes at least one arm mechanism 170 that is operable to open, close, and support a lid of the testing fixture. FIG. 3 illustrates a cross-sectional view of a printed circuit board testing fixture according to one embodiment of the present invention. FIG. 4 illustrates a side perspective of printed circuit board testing fixture according to one embodiment of the present invention. FIG. 5 illustrates a front view of a printed circuit board testing fixture.

Figure 6:
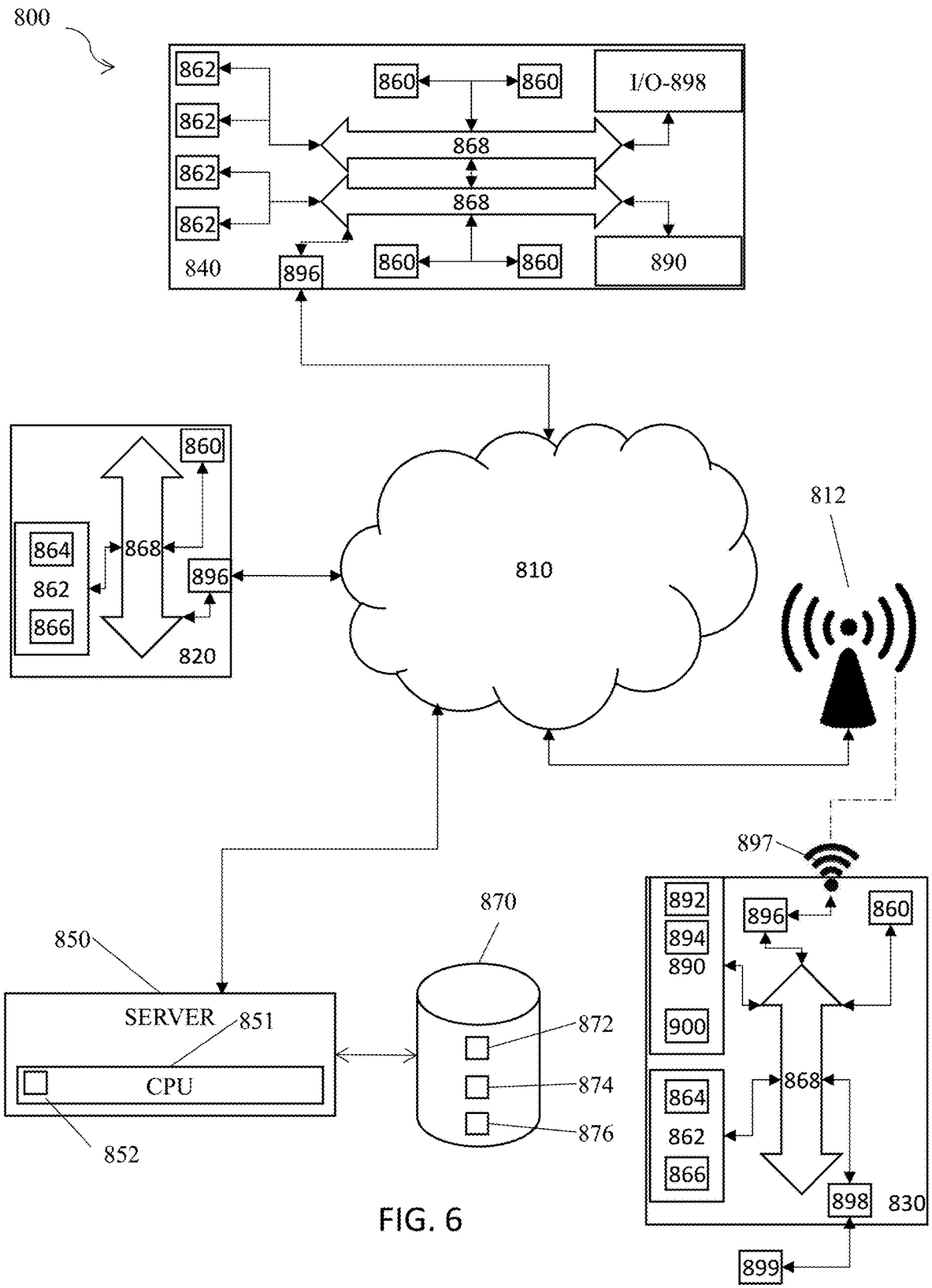
FIG. 6 is a schematic diagram of a system of the present invention.

FIG. 6 is a schematic diagram of an embodiment of the invention illustrating a computer system, generally described as 800, having a network 810, a plurality of computing devices 820, 830, 840, a server 850, and a database 870.

The server 850 is constructed, configured, and coupled to enable communication over a network 810 with a plurality of computing devices 820, 830, 840. The server 850 includes a processing unit 851 with an operating system 852. The operating system 852 enables the server 850 to communicate through network 810 with the remote, distributed user devices. Database 870 is operable to house an operating system 872, memory 874, and programs 876.

In one embodiment of the invention, the system 800 includes a network 810 for distributed communication via a wireless communication antenna 812 and processing by at least one mobile communication computing device 830. Alternatively, wireless and wired communication and connectivity between devices and components described herein include wireless network communication such as WI-FI, WORLDWIDE INTEROPERABILITY FOR MICROWAVE ACCESS (WIMAX), Radio Frequency (RF) communication including RF identification (RFID), NEAR FIELD COMMUNICATION (NFC), BLUETOOTH including BLUETOOTH LOW ENERGY (BLE), ZIGBEE, Infrared (IR) communication, cellular communication, satellite communication, Universal Serial Bus (USB), Ethernet communications, communication via fiber-optic cables, coaxial cables, twisted pair cables, and/or any other type of wireless or wired communication. In another embodiment of the invention, the system 800 is a virtualized computing system capable of executing any or all aspects of software and/or application components presented herein on the computing devices 820, 830, 840. In certain aspects, the computer system 800 is operable to be implemented using hardware or a combination of software and hardware, either in a dedicated computing device, or integrated into another entity, or distributed across multiple entities or computing devices.

By way of example, and not limitation, the computing devices 820, 830, 840 are intended to represent various forms of electronic devices including at least a processor and a memory, such as a server, blade server, mainframe, mobile phone, personal digital assistant (PDA), smartphone, desktop computer, netbook computer, tablet computer, workstation, laptop, and other similar computing devices. The components shown here, their connections and relationships, and their functions, are meant to be exemplary only, and are not meant to limit implementations of the invention described and/or claimed in the present application.

In one embodiment, the computing device 820 includes components such as a processor 860, a system memory 862 having a random access memory (RAM) 864 and a read-only memory (ROM) 866, and a system bus 868 that couples the memory 862 to the processor 860. In another embodiment, the computing device 830 is operable to additionally include components such as a storage device 890 for storing the operating system 892 and one or more application programs 894, a network interface unit 896, and/or an input/output controller 898. Each of the components is operable to be coupled to each other through at least one bus 868. The input/output controller 898 is operable to receive and process input from, or provide output to, a number of other devices 899, including, but not limited to, alphanumeric input devices, mice, electronic styluses, display units, touch screens, signal generation devices (e.g., speakers), or printers.

By way of example, and not limitation, the processor 860 is operable to be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

In another implementation, shown as 840 in FIG. 6, multiple processors 860 and/or multiple buses 868 are operable to be used, as appropriate, along with multiple memories 862 of multiple types (e.g., a combination of a DSP and a microprocessor, a plurality of microprocessors, one or more microprocessors in conjunction with a DSP core).

Also, multiple computing devices are operable to be connected, with each device providing portions of the necessary operations (e.g., a server bank, a group of blade servers, or a multi-processor system). Alternatively, some steps or methods are operable to be performed by circuitry that is specific to a given function.

According to various embodiments, the computer system 800 is operable to operate in a networked environment using logical connections to local and/or remote computing devices 820, 830, 840 through a network 810. A computing device 830 is operable to connect to a network 810 through a network interface unit 896 connected to a bus 868. Computing devices are operable to communicate communication media through wired networks, direct-wired connections or wirelessly, such as acoustic, RF, or infrared, through an antenna 897 in communication with the network antenna 812 and the network interface unit 896, which are operable to include digital signal processing circuitry when necessary. The network interface unit 896 is operable to provide for communications under various modes or protocols.

In one or more exemplary aspects, the instructions are operable to be implemented in hardware, software, firmware, or any combinations thereof. A computer readable medium is operable to provide volatile or non-volatile storage for one or more sets of instructions, such as operating systems, data structures, program modules, applications, or other data embodying any one or more of the methodologies or functions described herein. The computer readable medium is operable to include the memory 862, the processor 860, and/or the storage media 890 and is operable be a single medium or multiple media (e.g., a centralized or distributed computer system) that store the one or more sets of instructions 900. Non-transitory computer readable media includes all computer readable media, with the sole exception being a transitory, propagating signal per se. The instructions 900 are further operable to be transmitted or received over the network 810 via the network interface unit 896 as communication media, which is operable to include a modulated data signal such as a carrier wave or other transport mechanism and includes any delivery media. The term "modulated data signal" means a signal that has one or more of its characteristics changed or set in a manner as to encode information in the signal.

Storage devices 890 and memory 862 include, but are not limited to, volatile and non-volatile media such as cache, RAM, ROM, EPROM, EEPROM, FLASH memory, or other solid state memory technology; discs (e.g., digital versatile discs (DVD), HD-DVD, BLU-RAY, compact disc (CD), or CD-ROM) or other optical storage; magnetic cassettes, magnetic tape, magnetic disk storage, floppy disks, or other magnetic storage devices; or any other medium that can be used to store the computer readable instructions and which can be accessed by the computer system 800.

In one embodiment, the computer system 800 is within a cloud-based network. In one embodiment, the server 850 is a designated physical server for distributed computing devices 820, 830, and 840. In one embodiment, the server 850 is a cloud-based server platform. In one embodiment, the cloud-based server platform hosts serverless functions for distributed computing devices 820, 830, and 840.

In another embodiment, the computer system 800 is within an edge computing network. The server 850 is an edge server, and the database 870 is an edge database. The edge server 850 and the edge database 870 are part of an edge computing platform. In one embodiment, the edge server 850 and the edge database 870 are designated to distributed computing devices 820, 830, and 840. In one embodiment, the edge server 850 and the edge database 870 are not designated for distributed computing devices 820, 830, and 840. The distributed computing devices 820, 830, and 840 connect to an edge server in the edge computing network based on proximity, availability, latency, bandwidth, and/or other factors.

It is also contemplated that the computer system 800 is operable to not include all of the components shown in FIG. 6, is operable to include other components that are not explicitly shown in FIG. 6, or is operable to utilize an architecture completely different than that shown in FIG. 6. The various illustrative logical blocks, modules, elements, circuits, and algorithms described in connection with the embodiments disclosed herein are operable to be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application (e.g., arranged in a different order or partitioned in a different way), but such implementation decisions should not be interpreted as causing a departure from the scope of the present invention.

The above-mentioned examples are provided to serve the purpose of clarifying the aspects of the invention, and it will be apparent to one skilled in the art that they do not serve to limit the scope of the invention. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. A system for testing multiple printed circuit boards (PCBs) comprising:
 a PCB testing fixture;
 a battery tester;
 a data acquisition unit including a multiplexer;
 a software platform; and
 at least one remote device;
 wherein the data acquisition unit is in network communication with the software platform and the PCB testing fixture;
 wherein the at least one remote device is in network communication with the software platform;
 wherein the battery tester is connected to the PCB testing fixture and the data acquisition unit, wherein the battery tester is configured to provide an electric stimulus to the PCB testing fixture;
 wherein the PCB testing fixture is configured to receive a plurality of PCBs, wherein the plurality of PCBs includes a first PCB and a second PCB;
 wherein the PCB testing fixture is configured to provide the electric stimulus generated by the battery tester to each PCB of the plurality of PCBs;
 wherein the PCB testing fixture is configured to generate PCB output data for each PCB of the plurality of PCBs;
 wherein the PCB testing fixture is configured to transmit the PCB output data to the data acquisition unit;
 wherein the software platform is configured to analyze the PCB output data;
 wherein the software platform is configured to determine if each PCB of the plurality of PCBs meets at least one output requirement;

wherein the first PCB has a first output requirement, wherein the second PCB has a second output requirement, and wherein the first output requirement is different from the second output requirement; and wherein the at least one remote device is configured to display the analyzed PCB output data.

2. The system of claim 1, wherein the PCB output data includes voltage data, resistance data, and/or capacitance data.

3. The system of claim 1, wherein the software platform is configured to generate an alert if the at least one output requirement is not met.

4. The system of claim 1, wherein the software platform is configured to generate at least one recommendation based on the PCB output data.

5. The system of claim 1, wherein the first output requirement includes a first output voltage, current, and/or capacitance requirement, and wherein the second output requirement includes a second output voltage, current, and/or capacitance requirement.

6. The system of claim 5, wherein the first output voltage, current, and/or capacitance requirement includes a first voltage of about 30 volts, and wherein the second output voltage, current, and/or capacitance requirement includes a second voltage of about 17 volts.

7. The system of claim 1, wherein the plurality of PCBs further includes a third PCB, wherein the third PCB has a third output requirement, wherein the first output requirement is greater than the second output requirement, and wherein the second output requirement is greater than the third output requirement.

8. The system of claim 1, wherein the software platform is further configured to determine whether one or more of the plurality of PCBs has a short circuit and/or an open circuit based on the PCB output data, and wherein the software platform is further configured to provide at least one recommendation if the one or more of the plurality of PCBs has a short circuit and/or an open circuit.

9. The system of claim 1, wherein the software platform includes a training application, wherein the training application is configured to simulate a circuit, and wherein the simulated circuit is based on at least one specification requirement.

10. The system of claim 1, wherein the software platform includes a mobile application on at least one mobile device, wherein the mobile application is configured for augmented reality, virtual reality, problem solving, and/or analytics applications.

11. A method of simultaneously testing printed circuit boards (PCBs) comprising:
attaching at least two PCBs to a PCB testing fixture, wherein the PCB testing fixture is configured to receive a plurality of PCBs;
providing an electric stimulus to the at least two PCBs via a power source, wherein the power source is attached to the PCB testing fixture;
capturing PCB output data via the PCB testing fixture, wherein the PCB testing fixture includes a data acquisition unit to acquire the PCB output data;
transmitting the PCB output to a remote device via network communication;
analyzing the PCB output data via a software platform including an analysis component on the remote device;
determining whether the at least two PCBs meet at least one output requirement based on the PCB output data; and wherein the at least two PCBs include a first PCB and a second PCB, wherein the first PCB has a first output requirement, wherein the second PCB has a second output requirement, and wherein the first output requirement is different from the second output requirement.

12. The method of claim 11, further comprising generating an electrical circuit analysis report via the remote device, wherein the electrical circuit analysis report includes a component breakdown of the at least two PCBs.

13. The method of claim 11, further comprising the software platform generating at least one recommendation to improve one or more of the at least two PCBs based on the PCB output data.

14. The method of claim 11, further comprising simultaneously supplying the electric stimulus to the at least two PCBs, analyzing the PCB output data of the at least two PCBs, and generating at least one alert if the PCB output data of one or more of the at least two PCBs is below at least one voltage cutoff.

15. The method of claim 11, wherein the at least two PCBs include a third PCB, wherein the third PCB has a third output requirement, wherein the first output requirement is greater than the second output requirement, and wherein the second output requirement is greater than the third output requirement.

16. The method of claim 11, further comprising the software platform determining whether one or more of the at least two PCBs has a short circuit and/or an open circuit based on the PCB output data and the software platform providing at least one recommendation if the one or more of the at least two PCBs has a short circuit and/or an open circuit.

17. A system for testing multiple printed circuit boards (PCBs) comprising:
a PCB testing fixture;
a battery tester;
a data acquisition unit including a multiplexer;
a software platform; and
at least one remote device;
wherein the data acquisition unit is in network communication with the software platform and the PCB testing fixture;
wherein the at least one remote device is in network communication with the software platform;
wherein the battery tester is connected to the PCB testing fixture and the data acquisition unit, wherein the battery tester is configured to provide an electric stimulus to the PCB testing fixture;
wherein the PCB testing fixture is configured to receive a plurality of PCBs;
wherein the PCB testing fixture is configured to provide the electric stimulus generated by the battery tester to each PCB of the plurality of PCBs;
wherein the PCB testing fixture is configured to generate PCB output data for each PCB of the plurality of PCBs;
wherein the PCB testing fixture is configured to transmit the PCB output data to the data acquisition unit;
wherein the software platform is configured to analyze the PCB output data;
wherein the software platform includes a training application, wherein the training application is configured to simulate a circuit, and wherein the simulated circuit is based on at least one specification requirement; and
wherein the at least one remote device is configured to display the analyzed PCB output data.

18. The system of claim 17, wherein the PCB output data includes voltage data, resistance data, and/or capacitance data.

19. The system of claim 17, wherein the software platform is configured to generate at least one recommendation based on the PCB output data.

20. The system of claim 17, wherein the software platform includes a mobile application on at least one mobile device, wherein the mobile application is configured for augmented reality, virtual reality, problem solving, and/or analytics applications.

* * * * *